United States Patent [19]
Alinikula

[11] Patent Number: 5,786,728
[45] Date of Patent: Jul. 28, 1998

[54] CUBER BASED PREDISTORTION CIRCUIT AND MOBILE STATION USING THE SAME

[75] Inventor: Petteri Alinikula, Helsinki, Finland

[73] Assignee: Nokia Mobile Phones, Ltd., Salo, Finland

[21] Appl. No.: 671,069

[22] Filed: Jun. 27, 1996

[30] Foreign Application Priority Data

Jun. 30, 1995 [FI] Finland .................................. 953251

[51] Int. Cl.$^6$ ...................................... H03F 1/32
[52] U.S. Cl. .................. 330/149; 330/151; 455/63; 455/89; 455/95; 375/297
[58] Field of Search .................... 330/149, 151; 325/296, 297; 455/63, 89, 95

[56] References Cited

U.S. PATENT DOCUMENTS

| | | | |
|---|---|---|---|
| 3,825,843 | 7/1974 | Felsberg et al. | 328/163 |
| 4,157,508 | 6/1979 | Hecken | 328/142 |
| 4,532,604 | 7/1985 | Baker | 364/851 |
| 4,870,371 | 9/1989 | Gottwald et al. | 330/149 |
| 4,992,754 | 2/1991 | Blauvelt et al. | 330/149 |
| 5,164,884 | 11/1992 | Pesola | 361/386 |
| 5,172,068 | 12/1992 | Childs | 328/162 |

FOREIGN PATENT DOCUMENTS

| | | |
|---|---|---|
| 0 113 571 A1 | 7/1984 | European Pat. Off. . |
| 0 130 664 B1 | 1/1985 | European Pat. Off. . |
| 0 243 898 A3 | 11/1987 | European Pat. Off. . |
| 0 411 180 A1 | 2/1991 | European Pat. Off. . |

OTHER PUBLICATIONS

IEEE Trans.Veh.Technol., Vol. VT-34, No. 4, Nov. 1985, T. Nojima et al, "Cuber predistortion linearizer for relay equipment in 800 MHz band land mobile telephone system" p. 169 -p. 177.

*Primary Examiner*—James B. Mullins
*Attorney, Agent, or Firm*—Perman & Green, LLP

[57] ABSTRACT

The invention is related to a balanced cuber based predistortion circuit for predistorting an input signal ($v_{in}$), comprising a squarer (11) to produce a second order signal and signal dividing means (10', 14') for dividing the input signal and second order signal into differential signals. To produce a third order signal, the input signal and second order signal are mixed in multipliers (15, 16) and the output signals of the multipliers are combined in order to eliminate undesired components. According to the invention, the squarer also includes differential signal handling and combining means (12, 13), advantageously a push-push frequency doubler to produce a second order signal using differential signals. The phase (17) and amplification (18) of the third order signal are adjusted in order to produce a distortion compensation signal, and the input signal ($v_{in}$) and distortion compensation signal are combined (19) to produce a predistorted output signal ($v_1$).

9 Claims, 4 Drawing Sheets

CUBER BASED PREDISTORTION CIRCUIT AND MOBILE STATION USING THE SAME

FIELD OF THE INVENTION

The invention is related to a cuber based predistorting linearizer which linearizes the operation of an electronic circuit. Specifically the invention is related to a predistortion circuit or predistortion linearizer which is used for predistorting an input signal and includes a squarer for producing a second order signal, mixing means for mixing the input signal and the second order signal to produce a third order signal, phase and amplification controlling means for adjusting the phase and amplification of the third order signal in order to produce a distortion compensation signal, and means for combining the input signal and the distortion compensation signal in order to produce a predistorted output signal. The invention also relates to a cuber in such a predistortion circuit and to a mobile station having such a predistortion circuit.

BACKGROUND OF THE INVENTION

A non-linear circuit, such as a power amplifier, generates distortion. The most harmful and powerful distortion component is usually the third order distortion component. In order to improve the linearity of the operation of an electronic circuit it is known to predistort a signal brought to the circuit by deliberately generating higher order signal components which are used to cancel out corresponding signal components inadvertently produced in the circuit. This kind of predistortion linearization is used in amplifiers, for example. A widely used predistortion linearizer is based on the use of a cuber to produce a signal in cubic relationship with the input signal in order to compensate for the third order distortion component. The invention is related to the implementation of the cuber in such predistortion linearizer.

Many cuber arrangements are known in the art; a cuber similar to that mentioned above in the introduction is disclosed in U.S. Pat. No. 3,825,843, in which the cuber comprises several components, such as hybrid circuits, multipliers, bias circuits, amplifiers, a delay line, a squarer, and a high pass filter. The U.S. Pat. document also discloses a balanced cuber, referring to an arrangement for handling differential signals, wherein an input signal and a second order signal are both divided into two branches, which handle two signal components 180 degrees out of phase with each other, the components in phase are mixed with each other, and it is produced one combined third order signal by combining the signal components obtained from the mixing. The multipliers and the squarer are implemented using transformers and Schottky diodes, and these require bias circuits. In the balanced arrangement disclosed in the U.S. Pat. document it is also needed a high pass filter to prevent components at the signal frequency from passing through the cuber. Such an implementation of a cuber therefore requires a lot of components and includes components that prevent the cuber from being integrated into an integrated circuit. So there is no cuber known in prior art that could be integrated into an integrated circuit and prior art cubers are therefore not very suitable for mobile telephones, for example, in which it is preferred to use compact, space-saving components.

SUMMARY OF THE INVENTION

When developing the cuber arrangement, to which the invention is related, it was intended that the electronic circuit mentioned above would be a high-frequency power amplifier and specifically a power amplifier in a mobile telephone, but naturally the application range for the invention is not limited to these devices. Because of the intended preferred application, the object of the invention is to provide a cuber which is as compact and simple as possible, requires very few components and very little space and is operationally reliable and compatible with other circuit arrangements used. In addition, it is advantageous to provide a cuber which can be implemented as an integrated circuit.

The object of the invention is achieved using a differential signal squarer to produce a second order signal. Thus it is characteristic of the predistortion circuit, cuber and mobile station according to the invention that the squarer includes handling and combining means for a differential signal to produce a second order signal by combining two signals.

Advantageously the invention is implemented using a balanced cuber known from said U.S. Patent as a basis and utilizing differential signals, ie. signals that have a phase difference of 180 degrees, in the generation of a second order signal, and the squarer is a so-called push-push type frequency doubler, which includes in the first branch a first non-linear port to produce a multiple order component output from the first signal component, in the second branch a second non-linear port to produce a multiple order component output from the second signal component, which is 180 degrees out of phase with the first signal component, and means for combining the outputs of the first and second port, passing the second order components of the input signal and eliminating odd order signal components.

In a preferred embodiment the cuber is integrated in an integrated circuit. In the preferred application of the invention, a power amplifier in a mobile phone, the cuber is integrated in the same circuit with the power amplifier.

Compared to the balanced circuit arrangement disclosed in the U.S. Pat. No. 3,825,843 mentioned above, the arrangement according to the invention leads to component saving, because the high pass filter mentioned in said U.S. Pat. document to filter the signal frequency is not needed when the squarer comprises a push-push type frequency doubler which is fed with differential signals into two identical branches, in which case, when combining the outputs of both branches, the signal frequency (and odd harmonics in general) is cancelled. When using in a balanced cuber a push-push type frequency doubler as a squarer, there is no need in the circuit for extra components other than the squarer, since the required phase shifter to produce a 180-degree phase shift already exists in the circuit to provide the third order component.

In addition, the invention provides the advantage that the cuber can be implemented as an integrated circuit or as part of an integrated circuit. It is preferable to integrate it into the same circuit that includes the power amplifier or, generally, the electronic circuit the operation of which the cuber is intended to linearize. When the cuber is integrated into the same circuit with the electronic circuit to be linearized (or into a different circuit but using the same circuit technology), whereby it is implemented using the same circuit technology as is used in the electronic circuit, it is achieved very advantageous situation regarding, for example, compensation of temperature variation and transistor or circuit element parameter variation when the components are alike. So it is possible to implement a compact cuber which requires very few extra components and additional space and is well adapted to the surrounding circuit environment.

BRIEF DESCRIPTION OF THE DRAWINGS

The invention will be further understood from the following description with reference to the accompanying drawings, in which.

DETAILED DESCRIPTION OF THE INVENTION

Figure 1:
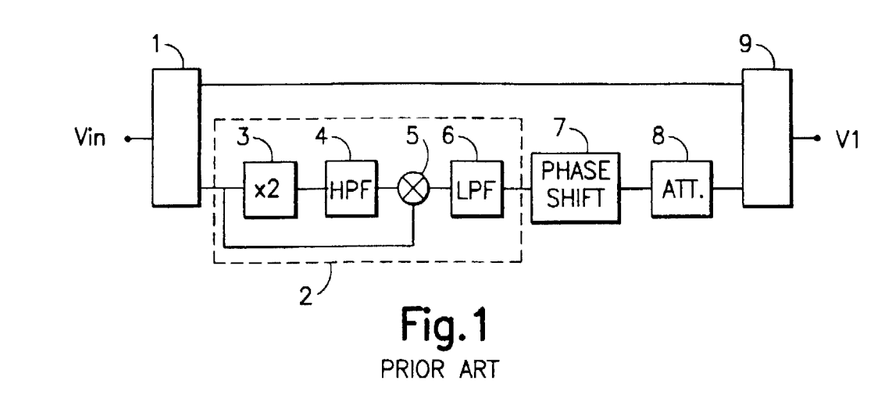
FIG. 1 illustrates schematically a conventional predistortion linearizer based on a cuber.

FIG. 1 is a block diagram of a conventional predistortion linearizer to which it is brought an input signal $v_{in}$ and which gives as output to an electronic circuit, such as a power amplifier, a predistorted signal $v_1$. The input signal $v_{in}$ is divided in block 1 into two branches, the first of which goes directly to the output, and in the second a distortion is generated. The broken line box 2 represents the cuber that generates the distortion. Within it, block 3 is a frequency doubler which produces a distortion term in quadratic relationship with the input signal $v_{in}$. A high pass filter 4 filters out the original signal frequency from the signal provided by the frequency doubler 3. In addition to the signal filtered by the high pass filter 4 also the input signal $v_{in}$ is brought directly to a mixer 5 which produces as an output a signal which has the frequency of the input signal $v_{in}$ and which is in cubic relationship with the original amplitude of the input signal $v_{in}$. A low pass filter 6 filters out from the signal obtained from the mixer frequencies that are two and three times the frequency of the input signal $v_{in}$. There remains, however, a desired component which is in cubic relationship regarding its power. A phase shifter 7 and an attenuator 8 are used to adjust the predistortion to the distortion characteristics of the electronic circuit, such as a power amplifier. For example, an amplifier has certain AM/AM and AM/PM distortion characteristics, ie. the dependence between the output amplitude of the amplifier and the input amplitude is non-linear and, on the other hand, the phase of the amplifier output is dependent on the amplitude level of the input signal to the amplifier. Blocks 7 and 8 are used to set phase shift and attenuation such that the generated predistortion compensates in the best possible way for the non-linearity characteristics of the amplifier. In block 9, the input signal $v_{in}$ brought to the block directly from the first branch is combined with the distortion signal generated in the second branch to make a predistorted signal $v_1$ which is taken to the electronic circuit, such as a high-frequency amplifier.

Below it will be discussed the principle of operation of such a predistortion linearizer in conjunction with an amplifier. The non-linearity characteristics for the voltage amplification of a typical power amplifier can be approximated using the formula $$v_{out} = a_1 v_1 - |a_3| v_1^3 \qquad (1)$$

where $v_{out}$ is the voltage signal from the amplifier, $v_1$ is the voltage obtained from the predistortion linearzer as input to the amplifier, $a_1$ is the linear voltage amplification of the power amplifier, and $a_3$ is the third order distortion term of the power amplifier. A fixed predistortion linearizer produces signal $v_1$ which is $$v_1 = b_1 v_{in} + |b_3| v_{in}^3 \qquad (2)$$

where $v_{in}$ is the input signal for the predistortion linearizer, b1 is the linear voltage amplification of the linearizer circuit, and $b_3$ is the third order distortion term of the linearizer circuit. For the voltage signal $v_{out}$ provided by the amplifier we get the expression $$v_{out} = a_1(b_1 v_{in} + |b_3| v_{in}^3) - |a_3|(b_1 v_{in} + |b_3| v_{in}^3)^3 = a_1 b_1 v_{in} + a_1 |b_3| v_{in}^3 - |a_3| |b_1| v_{in}^3 \qquad (3)$$

when assuming that, compared to linear terms $a_1$ and $b_1$, distortion terms $a_3$ and $b_3$ are so small that their product $a_3 b_3$ can be ignored. So the distortion terms are eliminated from the total voltage amplification if the linearizer is designed so that $$b_1|a_3|=a_1|b_3|.$$

Figure 2:
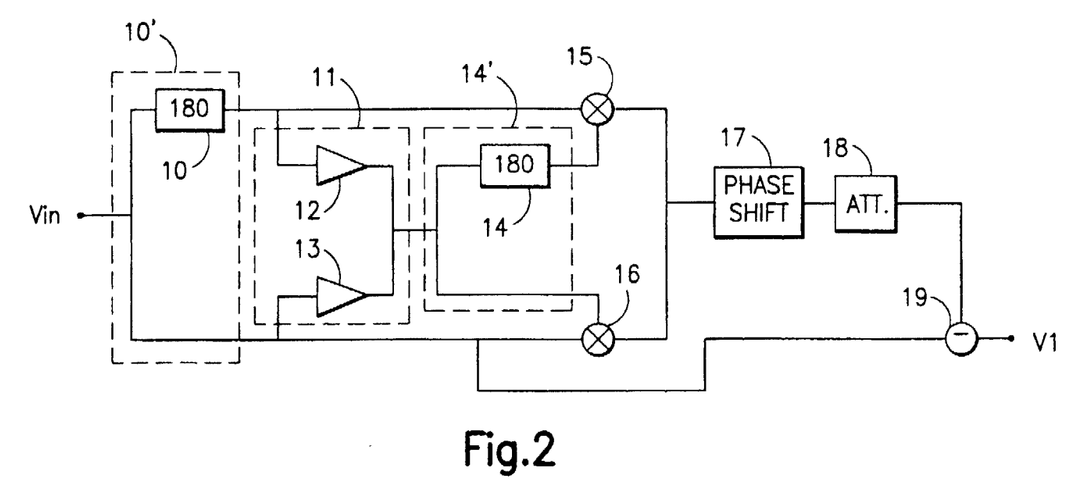
FIG. 2 illustrates schematically a cuber and a predistortion linearizer according to the invention.

FIG. 2 shows a predistortion linearizer according to the invention and the cuber arrangement used in it. The cuber according to the invention is based on a balanced structure including a squarer 11 to produce a second order signal. The input signal $v_{in}$ to the cuber is first divided into two branches, the first of which includes a phase shifter 10 to shift the phase of the signal in the first branch 180 degrees with respect to the signal in the second branch. A single-ended input signal $v_{in}$ is thus made differential in the differential signal generation block 10'.

In addition, the squarer output is divided into two branches in a corresponding manner, and in the first branch there is a phase shifter 14 to shift the phase of the signal in the first branch 180 degrees with respect to the signal in the second branch. The 180 degrees phase-shifted input signal and the 180 degrees phase-shifted second order signal are mixed in a mixer 15 in the first branch of the cuber to provide a third order signal in the first branch. Similarly, an input signal and a second order signal in phase with it are mixed in a mixer 16 in the second branch to provide a third order signal in the second branch. The signals from both branches are combined to produce a single third order signal.

The push-push type squarer in block 11 utilizes differential input signals. The push-push type squarer comprises two identical branches. Both branches include a non-linear port, advantageously a two-port, such as a transistor or an operational amplifier. The non-linear ports 12 and 13 generate from the input signal $v_{in}$ an infinite series of harmonic frequency components. When the two identical non-linear ports 12 and 13 are fed with signals having opposite phases, the odd harmonic frequency components are cancelled at the output when summed. The most important cancelled components are the signal frequency f1 and the third harmonic frequency f3. Fourth and higher order harmonic frequencies can be assumed to be so weak that they do not affect the operation of the circuit. So the output signal of the differentially driven push-push type frequency doubler 11 is signal f2 which has a frequency two times higher than that of the input signal $v_{in}$, and a strength which is quadratically dependent on the input signal strength.

As was mentioned above, the single-ended double-frequency signal f2 obtained from the squarer 11 is made differential in the differential signal generation block 14' by taking it to two different branches and using a phase inverter 14 to produce a 180-degree phase shift between the signals in the branches. Mixers 15 and 16, which may be analog multipliers, generate the product of the input signals brought to them. One of the input signals of mixers 15 and 16 has the original signal frequency f1 and the other signal, coming from block 11, has a doubled frequency f2. Hence, the output signal of multipliers 15 and 16 ideally has two terms: one at the signal frequency (2f−f=f) and the other at a triple frequency (2f+f=3f). The triple-frequency signal does not benefit the operation and it can be eliminated later, e.g. in the matching circuits of the amplifier to be linearized. The leakage signals of the unideal multipliers 15 and 16 at the signal frequency and at the double frequency are cancelled out when summing the output signals of the two multipliers. For this cancellation it was used differential signals and, hence, it became possible to separate the leakage signals proportional to the input signal amplitude and to the square of the amplitude from the desired cubic output signal. According to the non-linearity characteristics of the amplifier to be linearized the correction signal level can be changed in an attenuator 18 and the phase in a phase shifter 17. These have fixed settings and do not require adjusting during operation. Depending on the phase characteristics the correction term is either added to or subtracted from the original signal in block 19 to produce a predistorted output signal, or distortion compensation signal, as an output for the electronic circuit to compensate for the distortion generated in the electronic circuit, such as a power amplifier.

In a circuit arrangement according to the invention, the push-push type frequency doubler, the mixers and the phase inverters can be implemented with one kind of circuit technology and thus with one kind of circuit elements. Said circuit blocks are advantageously realized as active circuits using transistors as base elements, which are implemented with the same circuit technology as is applied in the actual electronic circuit, such as a high-frequency amplifier. Considering the preferred application of the invention, the circuit technology may be especially suitable for high-frequency applications, such as bipolar, BiCMOS, MESFET, HEMT or HBT-GaAs technology. The invention as such is not limited to the integrating technology used. When implemented in this way, the cuber of the predistortion linearizer can easily be integrated e.g. into the same integrated circuit which contains the actual electronic circuit. Analog signal handling in the circuit is based on very precise likeness of active components, primarily transistors, which in practice can be achieved only in an integrated circuit where the differences between adjacent components are minimal. Although a relatively great number of circuit elements are needed to implement the circuit blocks, the number of additional components needed remains small since the major part of the components can be located in the integrated circuit and because there is no need for filters, for example. Integration and implementation based on one kind of circuit technology also has the advantage that temperature variation and process variation will have the same effects on the characteristics of both the actual electronic circuit and the predistortion linearizer. The effects of these variations can then be easily accounted for in circuit design.

The arrangement according to the invention also helps implement the predistortion linearizer as a fixed and hence simple arrangement which requires no feedbacks or control loops, which would be needed if the linearizer had to be made variable or adaptive. When the cuber according to the invention is implemented using active blocks, it has the further advantage that the blocks can be made amplifying, whereby no separate amplifiers are needed, unlike in many known arrangements.

Figure 3:
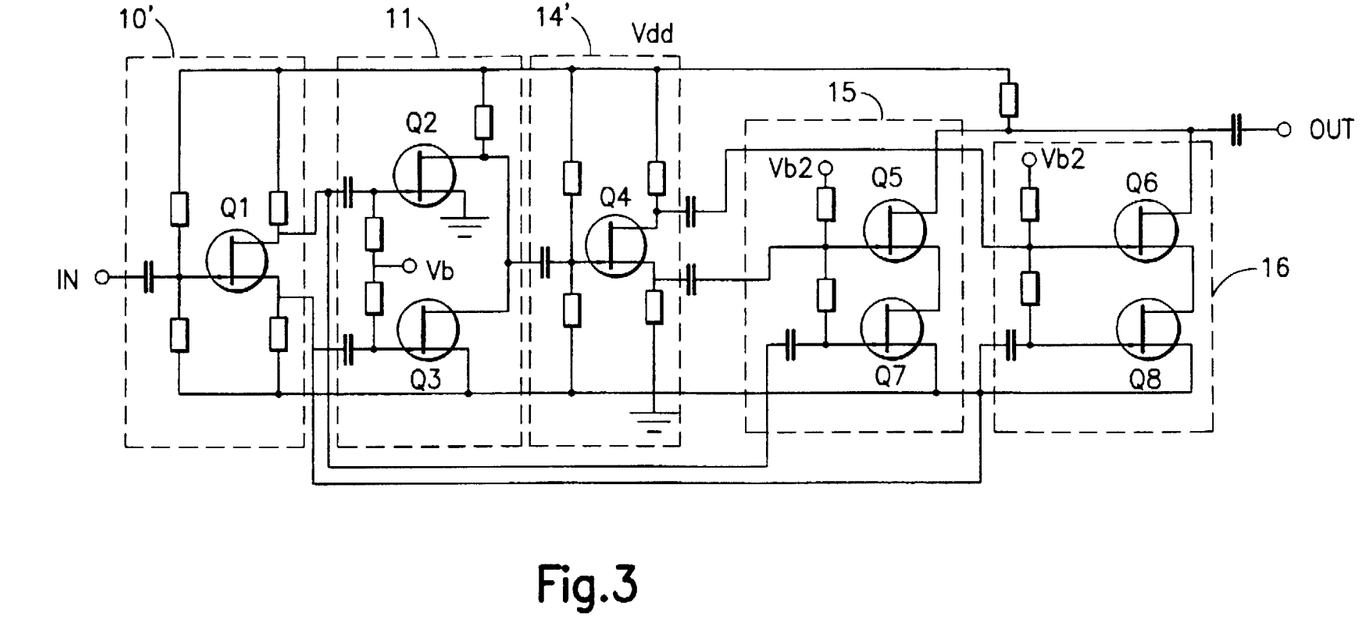
FIG. 3 is a circuit diagram illustrating an embodiment of the cuber according to the invention.

FIG. 3 shows a detailed circuit diagram of an embodiment of the cuber according to the invention. In the figure, circuit block 10' including transistor Q1 is a phase divider which uses one signal brought to the input IN to generate two out-of-phase signals having a phase difference of 180 degrees. The circuit blocks built around transistors Q2 and Q3 serve as non-linear ports 12 and 13 for a push-push frequency doubler, constituting a squarer 11. Transistors Q2 and Q3 having a same biasing voltage vb are controlled by signals from transistor Q1 having a 180-degree phase shift relative to each other and, therefore, the fundamental components of the drain currents of transistors Q2 and Q3 are in opposite phases and, hence, the transistors effectually short-circuit each other at the fundamental frequency. So there is in this arrangement no need for conventional filtering to eliminate the fundamental frequency. Between the second harmonics of the drain currents of these two transistors there is no phase difference and therefore the drain current components at this frequency are combined in phase at the output.

This output, which has a frequency two times the fundamental frequency, is used for generating by means of a phase divider 14' built around transistor Q4 a differential signal comprising two signals 180 degrees out-of-phase with each other. Transistors Q5 and Q7 and correspondingly Q6 and Q8, which all have the same biasing voltage vb2, form two dual-gate-FET type mixers 15 and 16 to which it is brought an input signal at the fundamental frequency from the first phase divider 10' and a double-frequency signal from the corresponding output of the second phase divider 14'. The outputs of the mixers 15 and 16 are summed, thus cancelling out the leakage signals of the mixers at the signal frequency and at the doubled frequency and separating and eliminating these signals proportional to the input signal amplitude and the square of the amplitude from the desired signal in cubic relationship with the input signal which appears at the output OUT (to be taken further to a phase shifter 17 and an attenuator 18).

Figure 4:
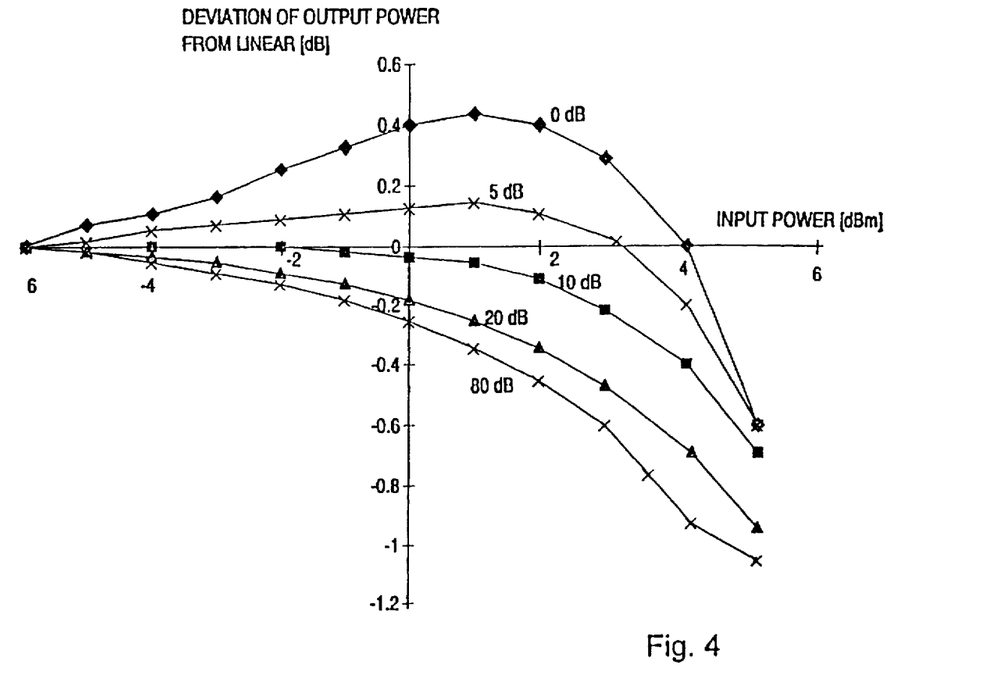
FIG. 4 illustrates simulated operation of a predistortion linearizer using a cuber according to the invention when the electronic circuit constitutes a high-frequency power amplifier.

FIG. 4 illustrates the operation of a fixed predistortion linearizer according to the invention and is based on a simulation in which a certain non-linear amplifier model was used. Values marked beside the curves in the figure represent the deviation of output power from the linear value with respect to the input power at various attenuation settings of an attenuator included in the fixed predistortion linearizer. Thus, the 80-dB attenuation curve illustrates the non-linearity characteristics of the amplifier model used. For example, a maximum of 0.2 dB deviation from the linear behaviour could be required of the operation of the circuit. Simulation results show that in this kind of case, it is possible to achieve, with a suitable attenuator value, even a 5-dB improvement on the linear power range.

The cuber according to the invention employs a squarer that handles differential signals, which leads to significant component saving, and by further implementing the squarer in a known balanced cuber, it is possible to save more components, as it is possible to use the same phase dividers both for the squarer to produce the quadratic singal and for the generation of the cubic signal. In addition, the structure according to the invention can be integrated as one integrated circuit or in the same circuit with the component to be linearized, such as a power amplifier, which makes it advantageous for use in mobile phones, for example.

A primary application field for the invention could be a high-frequency amplifier in a radio telephone and the invention can as well be applied to any communications transmitter in which the modulation used requires linear amplification. The cuber according to the invention can especially be used in digital cellular systems using the π/4-shift QPSK modulation; e.g. the JDC (Japan Digital Cellular) and DAMPS (Digital Advanced Mobile Phone Service) are such systems.

Figure 5:
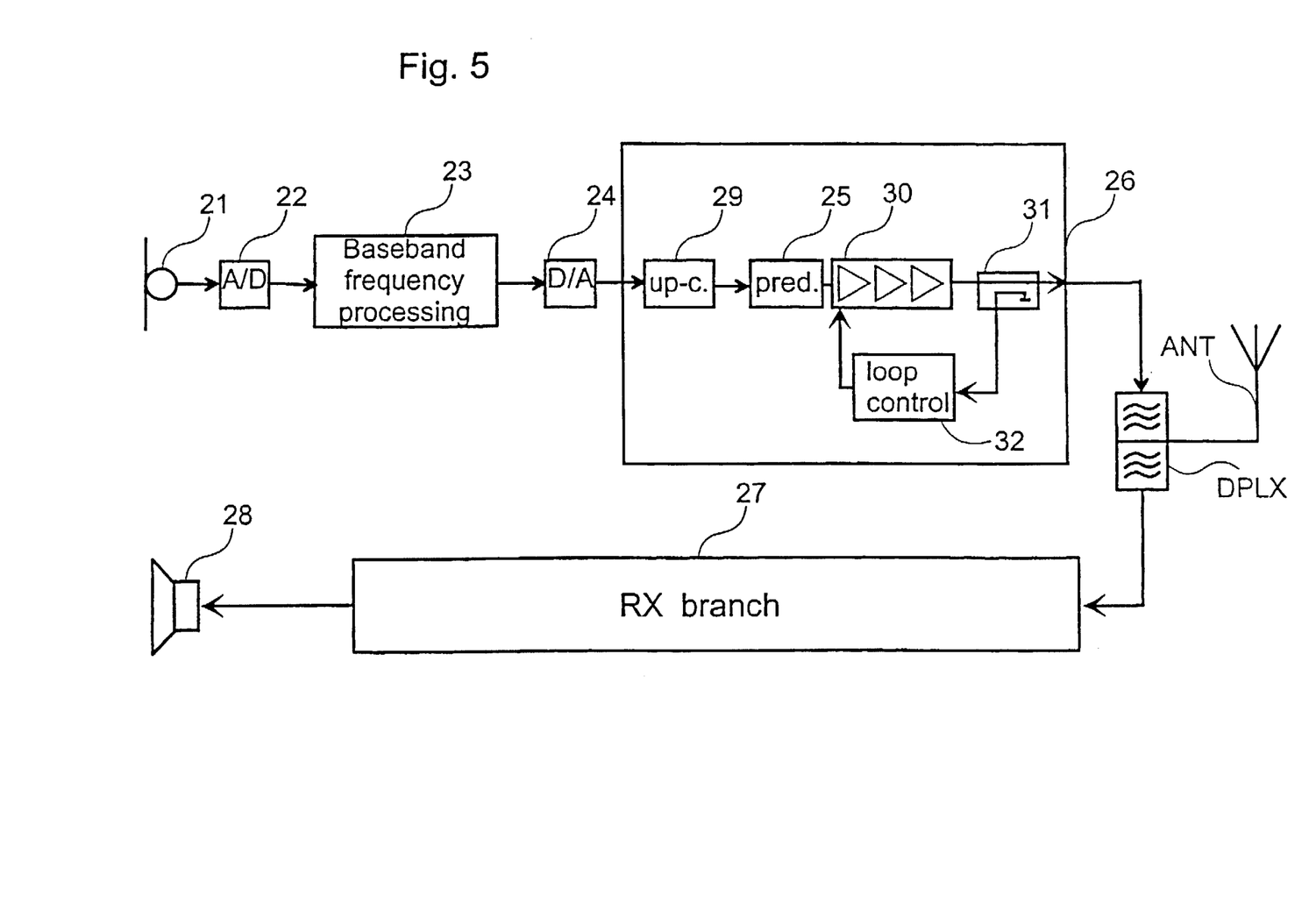
FIG. 5 presents in form of a block diagram a mobile station according to the invention.

FIG. 5 presents a mobile station according to the invention, in which predistortion according to the invention is employed. A speech signal to be transmitted, coming from a microphone 21, is sampled in an A/D converter 22, after which base frequency signal processing is carried out in block 23, including e.g. speech encoding, channel encoding, interleaving, modulation as known in the state of art. After this the signal is converted into analog form in a D/A converter 24 and is transformed into radio frequency and transmitted by a transmitter 26 through a duplex filter DPLX and an antenna ANT.

In the transmitter 26 before the power amplifier 30 is placed a predistortion circuit 25 according to the invention, e.g. such as is shown in FIG. 2. The predistortion circuit 25 can be integrated as part of the transmitter or it can be separated from the transmitter. The predistortion circuit 25 linearizes the operation of the transmitter 26, especially it linearizes the operation of the power amplifier 30 of the transmitter. The power amplifier 30 is normally a multi-stage amplifier. A transmitter usually comprises an up-conversion block 29, which up-converts the modulated signal to radio frequency normally with the aid of one or several intermediate frequencies. The rf signal output from the up-conversion block 29 is then fed to the predistortion circuit 25 and the power amplifier 30 which amplifies the signal for transmission. The output power is controlled by a power sensing element 31 and a loop control circuit 32 which controls the power level according to the signal received from the power sensing element 31 by controlling the power amplifier 30 accordingly. The amplified rf signal is transmitted through the antenna ANT on the radio path. The known operations of a reception branch 27 are carried out for speech received at reception, and it is repeated through loudspeaker 28. The signals processed in the transmission and reception branches may as well be data signals coming from the control block (not shown) of the mobile station or from another part of the mobile station or from an external device coupled to the mobile station.

Naturally, application areas of the invention are not limited to these primary application fields, but the invention can be used in conjunction with any electronic circuit when it is needed predistortion linearization based on the use of a cuber and when the implementation based on the inventive idea is suitable for the purpose.

Here realization and embodiments of the invention have been presented by examples on the circuit and mobile station. It is evident for a person skilled in the art that the invention is not limited to the details of the presented embodiments and that the invention can be realized also in another form without deviating from the characteristics of the invention. The presented embodiments should only be regarded as illustrating, not limiting. Thus the possibilities to realize and use the invention are limited only by the enclosed claims. Hereby different alternatives for the implementing of the invention defined by the claims, including equivalent realizations, are included in the scope of the invention.

I claim:

1. A predistortion circuit for predistorting an input signal ($v_{in}$), including
    a squarer (11) for producing a second order signal,
    mixing means (15, 16) for mixing the input signal ($v_{in}$) and the second order signal in order to produce a third order signal,
    phase and amplification control means (17, 18) to adjust the phase and amplification of the third order signal in order to produce a distortion compensation signal, and
    means (19) for combining the input signal ($v_{in}$) and the distortion compensation signal in order to produce a predistorted output signal ($v_1$), characterized in that the squarer (11) includes differential signal handling and combining means (12, 13) to produce the second order signal by combining two signals, wherein the squarer (11) is constructed with active components operated in a push-push configuration so as to substantially eliminate odd order signal components from the second order signal.

2. The predistortion circuit of claim 1, characterized in that it further includes
    first signal dividing means (10') to divide the input signal ($v_{in}$) into a first and a second signal component 180 degrees out of phase with each other,
    second signal dividing means (14') to divide the second order signal from the squarer (11) into a third and a fourth signal component 180 degrees out of phase with each other, and said mixing means (15, 16) further include
    first mixing means (15) to mix the first and the third signal component to produce a first third order signal component,
    second mixing means (16) to mix the second and the fourth signal component to produce a second third order signal component, and
    means for combining the first and the second third order signal component to produce the third order signal component adjusted by the chase and amplification control means (17, 18),
    and that said differential signal handling and combining means (12, 13) in the squarer (11) include
    a first non-linear port (12) to produce from said first signal component multiple order components as an output,
    a second non-linear port (13) to produce from said second signal component multiple order components as an output,
    means for combining the outputs of said first (12) and second (13) ports, for passing the second order components of the input signal, and for eliminating odd order signal components.

3. The predistortion circuit of claim 2, characterized in that said first non-linear port (12) and said second non-linear port (13) are identical.

4. The predistortion circuit of claim 1, characterized in that the squarer (11), mixing means (15, 16) and signal dividing means (10', 14') are all implemented using the same circuit technology.

5. The predistortion circuit of claim 1, characterized in that the squarer (11), mixing means (15, 16) and signal dividing means (10', 14') are implemented as active circuits using a transistor as a basic element.

6. The predistortion circuit of claim 1, characterized in that it is implemented as an integrated circuit or as part of an integrated circuit.

7. A cuber for cubing an input signal ($v_{in}$), including
    a squarer (11) for producing a second order signal, and
    mixing means (15, 16) for mixing the input signal ($V_{in}$) and the second order signal in order to produce a third order cubed signal,
characterized in that the squarer (11) includes differential signal handling and combining means (12, 13) to produce the second order signal by combining two signals wherein the squarer (11) is constructed with active components operated in a push-push configuration so as to substantially eliminate odd order signal components from the second order signal.

8. A mobile station for wireless communication having a transmitter branch and a receiver branch, the transmitter branch comprising a transmitter (26, 29) for producing a transmittance signal in the form of a radio frequency signal, and a predistortion circuit (25) for predistorting an input signal ($v_{in}$) in the transmitter branch and for outputting a predistorted output signal ($v_1$) for the transmitter (26) for linearizing the operation of said transmitter, the predistortion circuit (25) including a squarer (11) for producing a second order signal, mixing means (15, 16) for mixing said input signal ($v_{in}$) and said second order signal in order to produce a third order signal, phase and amplification control means (17, 18) to adjust the phase and amplification of a third order signal in order to produce a distortion compensation signal, and means (19) for combining said input signal ($v_{in}$) and said distortion compensation signal in order to produce said predistorted output signal ($v_1$), characterized in that the squarer (11) includes differential signal handling and combining means (12, 13) to produce the second order signal by combining two signals wherein the squarer (11) is constructed with active components operated in a push-push configuration so as to substantially eliminate odd order signal components from the second order signal. Please add the following new claim.

9. A power amplifier integrated circuit comprising:

an RF power amplifier circuit for amplifying a predistorted RF signal;

a predistortion circuit having an input for coupling to an input RF signal to be amplified and an output coupled to an input of said RF power amplifier circuit;

said predistortion circuit being comprised of active components integrated within said integrated circuit with active components that comprises said RF power amplifier, said predistortion circuit further comprising:

a squarer for producing a second order signal, wherein said squarer includes differential signal handling and combining means to produce said second order signal by combining two signals derived from said input RF signal, wherein active components of said squarer operate in a push-push configuration so as to substantially eliminate odd order signal components from said second order signal;

mixing means for mixing said input RF signal and said second order signal in order to produce a third order signal;

phase and amplification control means to adjust phase and amplification of said third order signal in order to produce a distortion compensation signal; and means for combining said input RF signal and said distortion compensation signal in order to produce said predistorted RF signal for coupling to said input of RF power amplifier circuit.

* * * * *

UNITED STATES PATENT AND TRADEMARK OFFICE
CERTIFICATE OF CORRECTION

PATENT NO.   :   5,786,728
DATED        :   Jul. 28, 1998
INVENTOR(S)  :   Alinikula It is certified that error appears in the above-identified patent and that said Letters Patent is hereby corrected as shown below:

IN THE CLAIMS:

In column 8, line 26, the word "chase" should read --phase--
    column 8, line 60, add a comma after "signals".

In column 9, line 22, add a comma after "signals"
    column 9, line 26, delete entire line.

Signed and Sealed this

Fifth Day of January, 1999

Attest:

Attesting Officer

*Acting Commissioner of Patents and Trademarks*